(12) United States Patent
Reindl et al.

(10) Patent No.: US 7,764,104 B2
(45) Date of Patent: Jul. 27, 2010

(54) SELF CLOCK GENERATION

(75) Inventors: Richard Michael Reindl, Mt. Laurel, NJ (US); Byungchae Kim, Garnet Valley, PA (US)

(73) Assignee: L3 Communications Corporation, New York, NY (US)

( * ) Notice: Subject to any disclaimer, the term of this patent is extended or adjusted under 35 U.S.C. 154(b) by 0 days.

(21) Appl. No.: 12/034,347

(22) Filed: Feb. 20, 2008

(65) Prior Publication Data
US 2009/0206905 A1    Aug. 20, 2009

(51) Int. Cl.
*H03K 3/00* (2006.01)
(52) U.S. Cl. ..................................... 327/291
(58) Field of Classification Search ............ None
See application file for complete search history.

(56) References Cited

U.S. PATENT DOCUMENTS 6,404,260 B1 * 6/2002 Cruz-Albrecht ............ 327/299
6,963,250 B2 * 11/2005 Ngo et al. .................. 331/57
2005/0134335 A1 * 6/2005 Loh ........................... 327/156
2008/0136443 A1 * 6/2008 Wong ......................... 326/30

* cited by examiner

*Primary Examiner*—Lincoln Donovan
*Assistant Examiner*—Khareem E Almo
(74) *Attorney, Agent, or Firm*—Woodcock Washburn LLP (57) ABSTRACT

A clock signal may be generated for a receiving circuit without requiring an external oscillator. A first digital circuit may convert a first signal edge at an input into a first clock signal at an output, and a second digital circuit, in feedback connection with the first digital circuit, may generate a second signal edge at the input based on the first clock signal at the output. Then, the first circuit may convert the second signal edge at the input to a second clock signal at the output. Thus, the first circuit and the second circuit, in combination, may generate a continuous stream of signal edges at the input and clock signals at the output. The second circuit may communicate with the controller circuit that may indicate that a subsequent clock signal is needed. The controller circuit may send commands and receive status from the receiving circuit.

8 Claims, 5 Drawing Sheets

SELF CLOCK GENERATION

BACKGROUND

Synchronous digital logic circuits, such as those in secure communications devices, for example, may require a clock signal. The digital logic circuit may be an integrated circuit, such as a microchip, application specific integrated circuit (ASIC), or the like. The clock signal may provide a common timing, so that the individual electronic logic components work together properly.

Typically, the clock signal may be provided by an electronic oscillator. For example, a relaxation oscillator, a crystal oscillator, or the like, may produce an electronic signal or waveform. A relaxation oscillator may use analog components such as transistors, capacitors, inductors, or the like to create the waveform. A crystal oscillator may resonate a quartz crystal to create the waveform. Because the oscillators may use non-digital components, they may often be found external to the digital logic microchip.

The generated waveform may be a square wave, having square edges that transition from a high level to a low level and back again regularly over time. The transitions of the square wave may establish the common timing for the digital logic circuitry.

The use of an oscillator in a digital logic circuit application may degrade the efficiency of the overall design. For example, the oscillator may increase the number of electronic components, making the circuit more complex, physically larger, and more costly. The oscillator may increase power consumption of the circuit. Furthermore, because the digital logic circuit depends on the oscillator for timing, some electronics may not work when the oscillator is disabled.

Digital logic circuits may be vulnerable when their external oscillator is compromised. For example, a digital logic circuit required for the protection of sensitive, encrypted data may fail because of malicious tampering with the oscillator on which it depends.

SUMMARY

A clock signal may be generated without requiring an external oscillator. For example, a first digital circuit may define an input and an output. A second digital circuit may provide a feedback connection between the input and the output. The first digital circuit may convert a first signal edge at the input into a first clock signal at the output, and the second digital circuit may generate a second signal edge at the input based on the first clock signal at the output. Then, the first digital circuit may convert the second signal edge at the input to a second clock signal at the output. Thus, the first digital circuit and the second digital circuit, in combination, may generate a continuous stream of signal edges at the input and clock signals at the output.

For example, the first digital circuit may include a first delay unit, a second delay unit, and a switch. The first delay unit may define a first duration. The first delay unit may receive an input signal and may output a first delayed signal. The second delay unit may define a second duration. The second duration may be less than the first duration. The second delay unit may receive the input signal and may output a second delayed signal. The switch may output the clock signal by selecting the first delayed signal or an inverted first delayed signal according to the second delayed signal. The outputted clock signal may be provided to a controller circuit and any other clock driven digital circuits in and/or in connection with the device.

The second digital circuit may include a feedback circuit that generates a transition of the input signal. The feedback circuit may communicate with a controller circuit. The controller circuit may execute commands and receive status. The controller circuit may operate consistent with the timing of the outputted clock signal. The controller circuit may indicate to the feedback circuit whether a subsequent clock signal is needed. The feedback circuit may generate the transition of the input signal according to the clock signal and the indication from the controller circuit that a subsequent clock signal is needed. For example, the feedback circuit may toggle the state of a feedback signal to generate the transition of the input signal.

The clock generation provided by the digital circuits may be initialized by a pulse generator at the input. The pulse generator may create an initial transition of the input signal. The pulse generator may include a two-input XOR logic gate and a delay unit that generates a pulse based on a wake-up event. For example, the wake-up event may include a depression of a button and/or a sequence of buttons.

DETAILED DESCRIPTION

Generally, digital logic circuits operate on electrical signals. Typically, the electrical signals may be in a low state or a high state. For example, a low state may be −5 volts, and the high state may be +5 volts. The low state or the high state may be indicative of a binary one or zero. A transition in the states of the electrical signal may define a signal edge. For example, the transition from the low state to the high state may be a rising edge of the electrical signal. The transition from the high state to the low state may be a falling edge of the electrical signal.

A clock signal may define clock edges, for example, the rising edge and the falling edge of the clock signal. The clock signal may be used to synchronize digital circuits, such that logic changes in the digital circuits may be triggered by either the rising edge or the falling edge. Typically, the clock signal may repeat alternating rising edges and falling edges as may be required by the digital logic circuits they synchronize. For example, logic changes in a digital circuit may be triggered by the rising edge of the clock signal, and the falling edge of the clock signal may be considered a reset edge. Similarly, logic changes in a digital logic circuit may be triggered by the falling edge of the clock signal, and the rising edge of the clock signal may be considered the reset edge.

Figure 1:
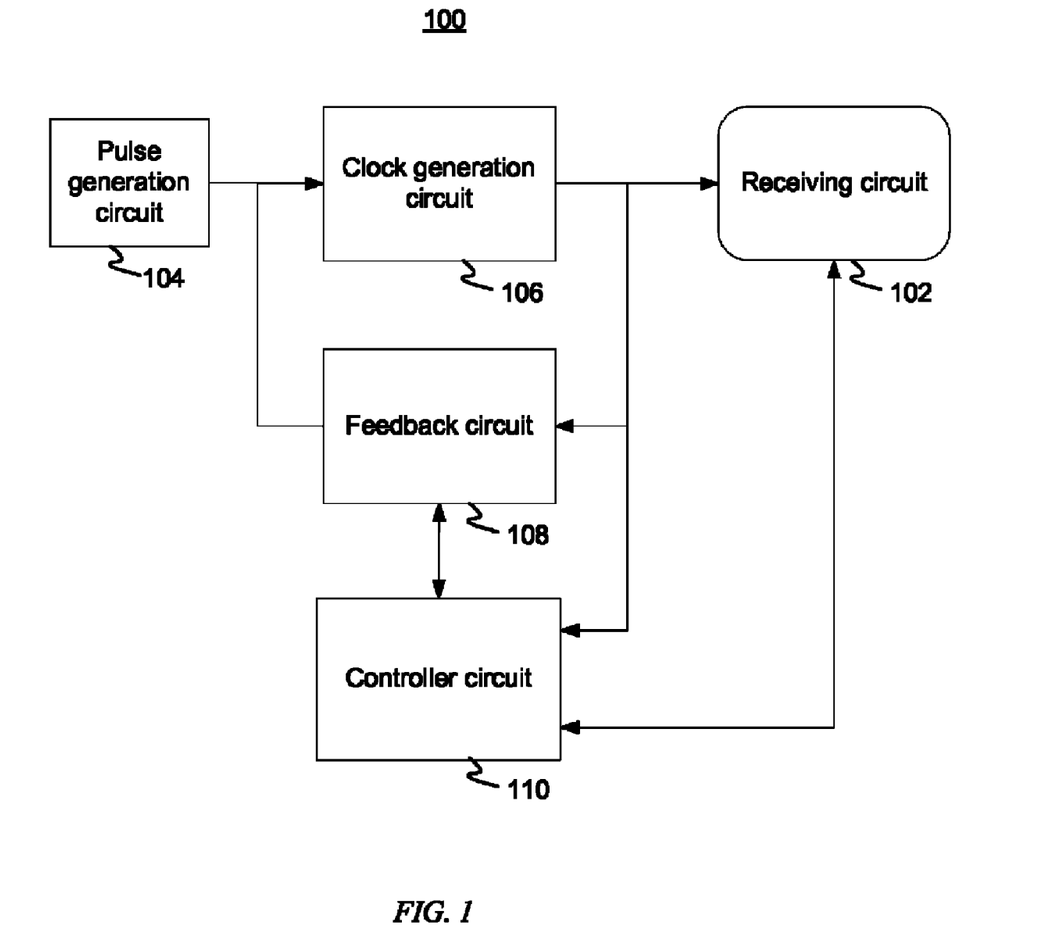
FIG. 1 depicts a block diagram of an example clock generation system.

FIG. 1 depicts a block diagram of an example clock generation system 100. The clock generation system 100 may provide a clock signal to a receiving circuit 102. The receiving circuit 102 may be any electronics application that may use a clock signal for operation. The receiving circuit 102 may be a digital logic circuit. The receiving circuit 102 may operate according to the rising edge and/or the falling edge of the clock signal.

The clock generation system 100 may include a pulse generation circuit 104, a clock generation circuit 106, a feedback circuit 108, and a controller circuit 110. The pulse generation circuit 104 may initiate the operation of the clock generation system 100 by providing an initial pulse signal to the clock generation circuit 106. The clock generation circuit 106 may convert a transition and/or signal edge of the pulse signal into a first clock signal. The first clock signal may be used by the receiving circuit 102 and/or the controller circuit 110. The controller circuit 110 may determine whether the receiving circuit 102 requests a subsequent clock signal. If the receiving circuit 102 does request a subsequent clock signal, the controller may direct the feedback unit to generate a subsequent transition for the clock generation circuit 106. The clock generation circuit 106 may convert the subsequent transition from the feedback circuit 108 into a subsequent clock signal that is provided to the receiving circuit 102. If the receiving circuit 102 does not request a subsequent clock signal, the controller may direct the feedback unit provide the same signal state to the clock generation circuit 106, concluding the operation of the clock generation system 100.

The pulse generation circuit 104 may be any component, system, subsystem suitable for generating an electric pulse signal. The pulse signal may include at least one rising edge and/or at least one falling edge. The pulse generation circuit 104 may generate a pulse signal responsive to a wake-up event. For example, the wake-up event may include the depression of a button and/or a sequence of buttons by a user. For example, the wake-up event may include an indication from another circuit. The pulse generation circuit 104 may be in communication with the clock generation circuit 106.

The clock generation circuit 106 may define an input and an output. The input of the clock generation circuit 106 may be in communication with the pulse generation circuit 104 and the feedback circuit 108. The output of the clock generation circuit 106 may be in communication with the feedback circuit 108, the receiving circuit 102, and/or the controller circuit 110. The clock generation circuit 106 may be any component, system, subsystem suitable for converting a state transition and/or signal edge at the input into a clock signal at the output. For example, the clock generation circuit 106 may convert a transition at the input into a clock edge at the output. For example, the clock generation circuit 106 may convert a transition at the input into a reset edge at the output.

The feedback circuit 108 may be any component, system, or subsystem suitable for generating a state transition and/or signal edge in response to a clock signal. The feedback circuit 108 may receive the clock signal at the output of the clock generation circuit 106 and may generate a signal edge at the input of the clock generation circuit 106 based on the clock signal received at the output of the clock generation circuit 106. For example, the feedback circuit 108 may generate a transition at the input from the clock edge received at the output. For example, the feedback circuit 108 may toggle the state of the input of the clock generation circuit 106 in response to a clock edge received at the output.

The feedback circuit 108 may operate autonomously. For example, the feedback circuit 108 may be programmed such that the clock generation system 100 provides a predetermined number of clock signals. The feedback circuit 108 may operate in response to an on/off indication. For example, another circuit may provide a on/off indication to the feedback circuit 108, such that when the feedback circuit 108 is on, the clock generation system 100 outputs clock signals continuously and when the feedback circuit 108 is off, the clock generation system 100 ceases the output of the clock signals. The feedback circuit 108 may operate in connection with a controller circuit 110.

The controller circuit 110 may be in communication with the clock generation circuit 106 and the feedback circuit 108. The controller circuit 110 may receive the output of the clock generation circuit 106 and may provide to the feedback circuit 108 an indication for a subsequent clock signal. The feedback circuit 108 may generate the signal edge in accordance with that indication for a subsequent clock signal.

The controller circuit 110 may be in communication with the receiving circuit 102. The controller circuit 110 may send a command signal to the receiving circuit 102. The command signal may be indicative of an instruction and/or operation of the receiving circuit 102. The controller circuit 110 may receive a status signal from the receiving circuit 102. The status signal may be indicative of the result of the instruction and/or operation indicated by the command. For example, the status signal may indicate whether a subsequent clock signal enables an operation of the receiving circuit 102.

To illustrate, the controller circuit 110 may send a command signal to the receiving circuit 102 directing the receiving circuit 102 to initiate an operation, for example, a memory erase operation. The receiving circuit 102 may begin to erase a portion of memory and may indicate in the status signal to the controller circuit 110 that the memory erase operation is not yet complete. The controller circuit 110 may determine that a subsequent clock signal may enable the continuation of the memory erase operation of the receiving circuit 102. The controller circuit 110 may indicate to the feedback circuit 108 that a subsequent clock signal may enable an operation of the receiving circuit 102.

The feedback circuit 108 may generate a subsequent clock signal for the receiving circuit 102. The receiving circuit 102 may receive the subsequent clock signal and continue the memory erase operation. The controller circuit 110 may continually indicate that a subsequent clock signal is desired until the receiving circuit 102 sends a status signal that the memory erase operation is complete. At this point, the controller circuit 110 may indicate to the next clock circuit that a subsequent clock signal would not further an operation of the receiving circuit 102 and that the operation of the clock generation system 100 may conclude.

Figure 2:
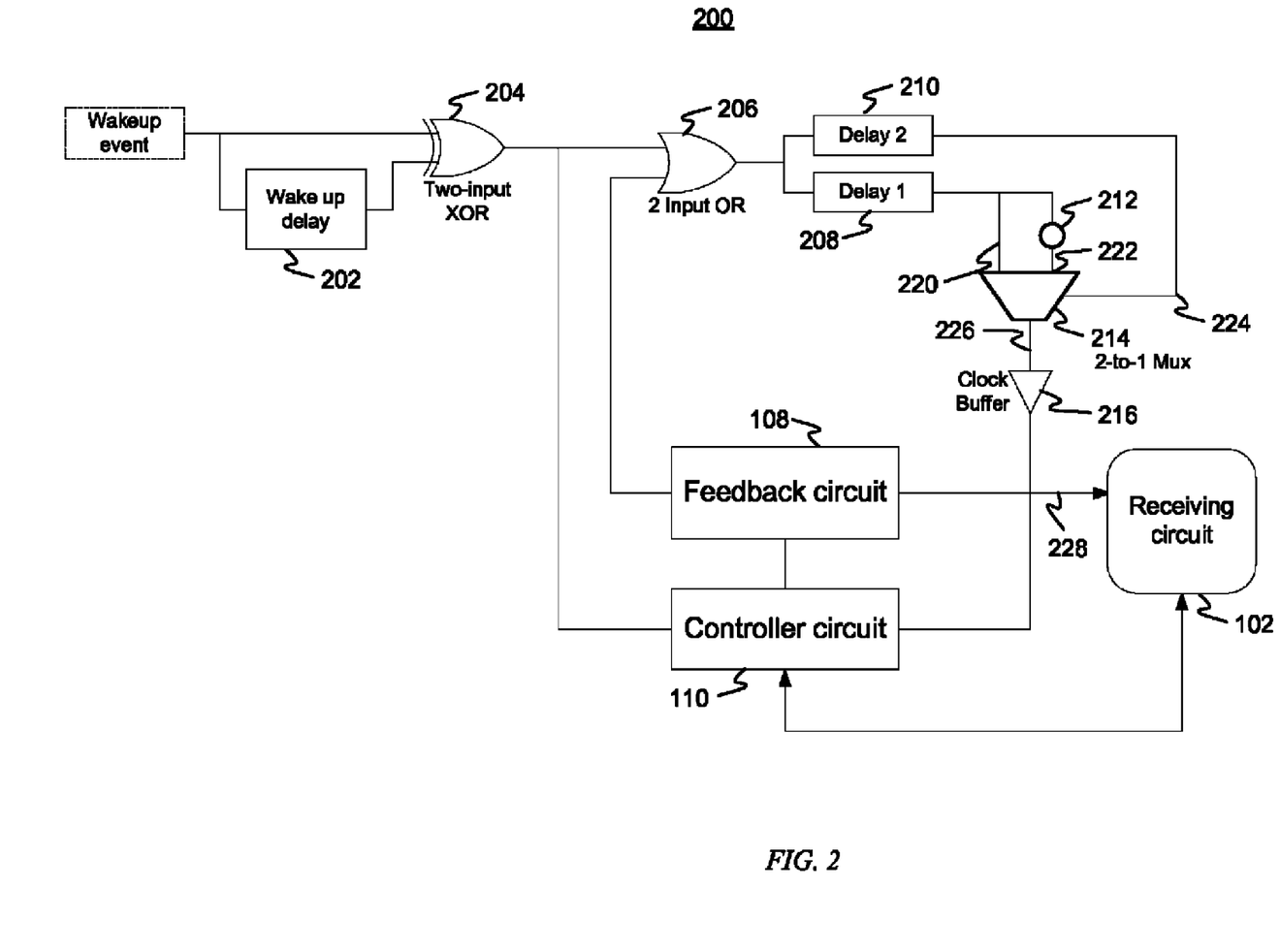
FIG. 2 depicts a detailed block diagram of an example clock generation system.

FIG. 2 depicts a detailed block diagram of an example clock generation system 200. The example clock generation system 200 may include a wake-up delay unit 202, a two-input XOR logic gate 204, a two-input OR logic gate 206, a first delay unit 208, a second delay unit 210, an inverter 212, a two-to-one multiplexer 214, a buffer 216, a feedback circuit 108, and/or a controller circuit 110.

The two-input XOR logic gate 204 may define two inputs. The first input may be connected to the output of the wake-up event. The second input may be connected to an output of the wake-up delay. An input to the wake-up delay may be connected to the output of the wake-up event. The two-input XOR logic gate 204 may define an output. The output of the two-input XOR logic gate 204 may be connected to an input of the two-input OR logic gate 206 and/or the controller circuit 110. The two-input XOR logic gate 204 may process the signals at the inputs according to an exclusive-OR logical operation.

The combination of a wake-up event, the wake-up delay unit 202, and/or the two-input XOR logic gate 204, in operation, may generate a reset pulse signal. The wake up event may include either a low-to-high transition or a high-to-low transition. For example, the wake up event may be generated from an external switch. The pulse at the output of the two-input XOR logic gate 204 may indicate a reset condition to the controller circuit 110. The trailing edge of the reset pulse may initiate clock generation. The wake-up delay may delay signal propagation according to a duration. The duration of the wake-up delay may define the width of the reset pulse signal.

The two-input OR logic gate 206 may define two inputs. The first input may be connected to the output of the two-input XOR logic gate 204. The second input may be connected to an output of the feedback circuit 108. The two-input OR logic gate 206 may define an output. The two-input OR logic gate 206 may process the signals at the inputs according to an logical OR operation.

The output of the two-input OR logic gate 206 may be connected to an input of the first delay unit 208 and an input of the second delay unit 210. The first delay unit 208 may define a first duration. A signal received at the input of the first delay unit 208 may propagate to an output of the first delay unit 208 having been delayed according to the first duration. For example, the first delay unit 208 may store the signal at the input for a length of time equal to the first duration and then propagate the signal to the output of the first delay unit 208. The first duration may be static characteristic of the first delay unit 208. The first duration may be variable and may be set dynamically during the operation of the clock generation system 200.

The second delay unit 210 may define a second duration. A signal received at the input of the second delay unit 210 may propagate to an output of the second delay unit 210 having been delayed according to the second duration. For example, the second delay unit 210 may store the signal at the input for a length of time equal to the second duration and then propagate the signal to the output of the second delay unit 210. The second duration may be static characteristic of the second delay unit 210. The second duration may be variable and may be set dynamically during the operation of the clock generation system 200.

In the operation of the clock generation system 200, the first duration may define a clock period. The frequency of the clock signal may be defined by the first duration. The receiving circuit 102 may define an operating frequency, and the first duration may be selected in accordance with the operating frequency of the receiving circuit 102. For example, the duration may be selected to generate a clock signal with a frequency equal to the operating frequency of the receiving circuit 102.

The second duration may be less than the first duration. The second duration may define the duty cycle of the clock signal. For example, the second duration may be one half of the first duration, and the clock signal may have a duty cycle of 50%.

The two-to-one multiplexer 214 may define a first input 220, a second input 222, a select input 224, and an output 226. The output of the first delay unit 208 may be connected to the first input 220 of the two-to-one multiplexer 214. The output of the first delay unit 208 may be connected to the inverter 212. The inverter 212 may be connected to the second input 222 of the two-to-one multiplexer 214. The output of the second delay unit 210 may be connected to the select input 224 of the two-to-one multiplexer 214.

The two-to-one multiplexer 214 may switch the first input 220 of the two-to-one multiplexer 214 or the second input 222 of the two-to-one multiplexer 214 to the output 226 of the two-to-one multiplexer 214 according to a signal at the select input 224 of the two-to-one multiplexer 214. For example, the two-to-one multiplexer 214 may switch the first input 220 to the output 226 when a signal present at the select input 224 is in a high state. The two-to-one multiplexer 214 may switch the second input 222 to the output 226 when a signal present at the select input 224 is in a low state. Conversely, the two-to-one multiplexer 214 may operate switching to the first input 220 according to a low state at the select input 224 and switching to the second input 222 according to a high state at the select input 224. The two-to-one multiplexer 214 may be substituted by any circuit, component, and/or collection of components that implements a controllable switching function.

The clock signal may be converted and/or generated at the output 226 of the two-to-one multiplexer 214. A clock edge and/or reset edge may be propagated via the two-to-one multiplexer 214 from the selected input. For example, a high-to-low transition may be present at the first input 220, the first input 220 may be switched to the output 226 via a high state at the select input 224, and the high-to-low transition may propagate to the output 226 of the two-to-one multiplexer 214 as a clock edge and/or reset edge. A clock edge and/or reset edge may be created via the switching action of the two-to-one multiplexer 214. For example, a high state may be present at the first input 220 of the two-to-one multiplexer 214 and a low state may be present at the second input 222 of the two-to-one multiplexer 214. A high-to-low transition may be created at the output 226 of the two-to-one multiplexer 214 by switching from the first input 220 to the second input 222. The switching may be controlled by the signal at the select input 224.

The output 226 of the two-to-one multiplexer 214 may be connected through the buffer 216 to an output 228 of the clock generation system 200. The buffer 216 may be a buffer amplifier. For example, the buffer 216 may be a unity gain buffer. The buffer 216 may provide electrical impedance transformation. The buffer 216 may prevent the receiving circuit 102 and/or other components at the output of the buffer 216 from unacceptably loading the two-to-one multiplexer 214 and/or other components at the input of the buffer 216. Such unacceptable loading may interfering with the operation of the two-to-one multiplexer 214 and/or other components at the input of the buffer 216. The output of buffer 216 may be connected to the receiving circuit 102, the controller circuit 110, and/or the feedback circuit 102.

The feedback circuit 102 may receive a clock signal from the output of the buffer 216. The feedback circuit 102 may toggle the state of the second input of the two-input OR logic gate 206 according to the clock signal received from the output of the buffer 216.

The feedback circuit 102 may operate under the control of the controller circuit 110. For example, the feedback circuit 102 may toggle the state of the second input of the two-input OR logic gate 206 upon receipt of a clock signal from the output of the buffer 216 and an indication from the controller circuit 110 that a subsequent clock signal is desired. For example, upon receipt of a clock edge, the feedback circuit 102 may transition the state of the second input of the two-input OR logic gate 206 from a low state to a high state. This transition may propagate to the first delay unit 208 and the second delay unit 210 to generate a subsequent clock signal. Upon receipt of the subsequent clock signal, the feedback circuit 102 may transition the state of the second input of the two-input OR logic gate 206 from the high state to a low state.

The controller circuit 110 may receive a clock signal from the output of the buffer 216. The controller circuit 110 may send commands to the receiving circuit 102 and may receive status from the receiving circuit 102. The controller circuit 110 may determine whether a subsequent clock signal is desirable for the operation of the receiving circuit 102. The control signal may indicate to the feedback circuit 102 to toggle the state of the second input of the two-input OR logic gate 206 upon receipt of a clock signal from the output of the buffer 216. If the controller circuit 110 determines that a subsequent clock signal is desirable for the operation of the receiving circuit 102, the controller circuit 110 may indicate such to the feedback circuit 102, and the feedback circuit 102 may toggle the state of the second input of the two-input OR logic gate 206 upon receipt of the clock edge. If the controller circuit 110 determines that a subsequent clock signal is not desirable for the operation of the receiving circuit 102, the controller circuit 110 may indicate such to the feedback circuit 102, and the feedback circuit 102 may maintain the state of the second input of the two-input OR logic gate 206 upon receipt of the clock edge.

Figure 3A:
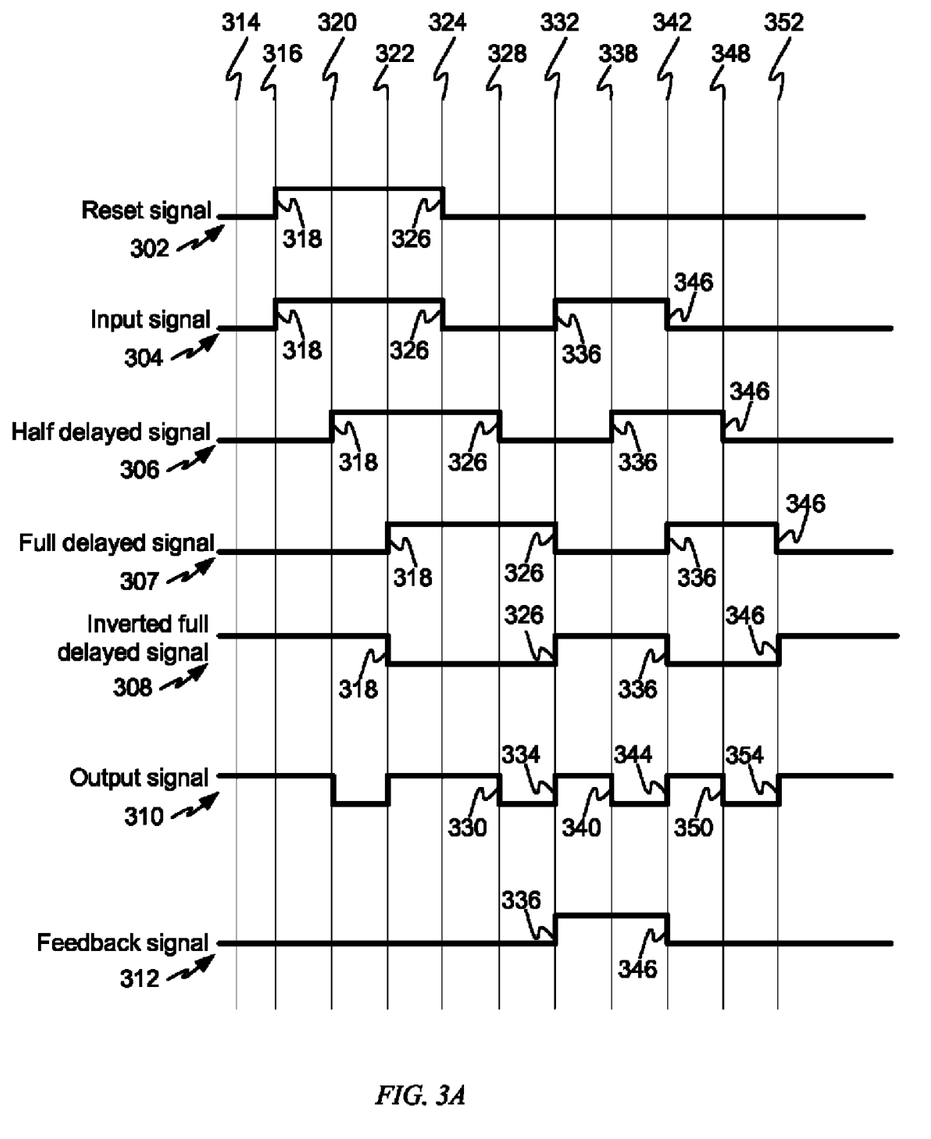
FIGS. 3A and 3B depict example timing diagrams illustrating clock generation and controller activity in connection with clock generation, respectively.

FIG. 3A depicts an example timing diagram illustrating clock generation. The example timing diagram may correspond to the operation of the circuit depicted in FIG. 2. The example timing diagram depicts a reset signal 302, an input signal 304, a half-delayed signal 306 306, a full-delayed signal 307, an inverted full-delayed signal 308, an output signal 310, and a feedback signal 312. The reset signal 302 may correspond to the output of the two-input XOR logic gate 204. The input signal 304 may correspond to the output of the two-input OR logic gate 206. The half-delayed signal 306 may corresponds to the select input 224 of the two-to-one multiplexer 214. The full-delayed signal 307 may correspond to the first input 220 of the two-to-one multiplexer 214. The inverted full-delayed signal 308 may correspond to the second input 222 to the two-to-one multiplexer 214. The output signal 310 may correspond to the output of the buffer 216. The feedback signal 312 may correspond to the output of the feedback circuit 102 at the second input of the two-input OR logic gate 206.

At 314, the system may be in an idle state. The reset signal 302, input signal 304, half-delayed signal 306, and full-delayed signal may be in a low state. The inverted full-delayed signal 308 may be in a high state. Because the half-delayed signal 306 is in a low state, the two-to-one multiplexer 214 may select the second input 222 for being switched to the output 226 of the two-to-one multiplexer 214. Thus, the output signal 310 may be in a high state, matching that of the inverted full-delayed signal 308. The feedback signal 312 may be in a low state.

At 316, a wake-up event may occur, generating a first edge 318 of the reset pulse. The first edge 318 of the reset pulse may be a rising edge. The first edge 318 of the reset pulse may be a falling edge. The first edge 318 of the reset pulse may propagate to the input signal 304. The half-delayed signal 306, the full-delayed signal 307, and the inverted full-delayed signal 308 may remain unchanged, in a low state, at 316, since the first edge 318 of the reset pulse has not yet propagated via the first delay unit 208 and/or the second delay unit 210. Similarly, the output signal 310 may remain in a high state, and the feedback signal 312 may remain in the low state.

At 320, the first edge 318 of the reset pulse may propagate to select input 224 of the two-to-one multiplexer 214 (i.e., the half-delayed signal 306). The time difference between the first edge 318 of the reset pulse at 316 and the first edge 318 of the reset polls at 320 may be represented by the duration associated with the second delay unit 210. The half-delayed signal 306 may transition from a low state to a high state, thus causing the two-to-one multiplexer 214 to switch from the second input 222 to the first input 220. Accordingly, the output signal 310 may transition from the high state associated with the inverted full-delayed signal 308 to the low state associated with the full-delayed signal 307. The feedback signal 312 may remain in the low state.

At 322, the first edge 318 of the reset pulse may propagate via the first delay unit 208 as represented by the full-delay signal and the inverted full-delayed signal 308. The half-delayed signal 306 may remained unchanged, in the high state. Accordingly, the two-to-one multiplexer 214 may continue to select the full-delayed signal 307, and the low-to-high transition of the full-delayed signal 307 may propagate to the output signal 310. Thus, at 322, the output signal 310 may transition from a low state to a high state. The feedback signal 312 may remain in the low state.

At 324, the reset pulse may have a second edge 326. The duration between the first edge 318 of the reset pulse and the second edge 326 of the reset pulse may correspond to the duration of the wake-up delay. The second edge 326 of the reset pulse may be a transition from a high state to a low state. The second edge 326 of the reset pulse may propagate to the input signal 304. The half-delayed signal 306 may remain in the high state, at 324. The full-delayed signal 307 may remain in the high state, and the inverted full-delayed signal 308 may remain in the low state. Accordingly, the output signal 310 may remain in the high state, at 324. The feedback signal 312 may remain in the low state.

At 328, the second edge 326 of the reset pulse may propagate to the half-delayed signal 306. The half-delayed signal 306 may transition from a high state to a low state. The full-delayed signal 307 may remain in the high state. The inverted full-delayed signal 308 may remain in a low state. Because the half-delayed signal 306 at the select input 224 of the two-to-one multiplexer 214 may transition from the high state to the low state, the two-to-one multiplexer 214 may switch from the first input 220 to the second input 222. Accordingly, the output signal 310 may reflect this switch by a transitioning from a high state (that is of the full-delayed signal 307, at 328) to a low state (that is of the inverted full-delayed signal 308, at 328). This transition of the output signal 310 may represent a first reset edge 330 of the clock signal. The feedback signal 312 may remain in the low state.

At 332, the reset signal 302 may be in a low state. The second edge 326 of the reset pulse may propagate to the full-delayed signal 307 and the inverted full-delayed signal 308. Accordingly, the full-delayed signal 307 may transition from a high state to a low state, and the inverted full-delayed signal 308 may transition from a low state to a high state. The half-delayed signal 306 may remain in the low state, at 332. Because the half-delayed signal 306 at the select input 224 to the two-to-one multiplexer 214 remains in the low state, the two-to-one multiplexer 214 may propagate the low-to-high transition of the inverted full-delayed signal 308 to the output signal 310. Thus, the second edge 326 of the reset pulse may be converted to a first clock edge 334 of the output signal 310. The first clock edge 334 may be a transition from a low state to a high state. The feedback circuit 102 may receive the first clock edge 334, and the feedback signal 312 may toggle from a low state to a high state, representing a first next-clock transition 336. The first next-clock transition 336 of the feedback signal 312 at 332 may propagate to the input signal 304.

At 338, the input signal 304 may be in a high state. The first next-clock transition 336 may propagate to the half-delayed signal 306. The half-delayed signal 306 may transition from a low state to a high state. The full-delayed signal 307 may remain in a low state. The inverted full-delayed signal 308 may remain in a high state. Because the half-delayed signal 306 presents a transition from a low state to a high state the output of the two-to-one multiplexer 214 may switch from the second input 222 to the first input 220. The inverted full-delayed signal 308, present at the second input 222 of the two-to-one multiplexer 214, may be in a high state. The full-delayed signal 307, at the first input 220 of the two-to-one multiplexer 214, may be in a low state. Switching from the second input 222 to the first input 220 may generates a transition from a high state to a low state at the output 226 of the two-to-one multiplexer 214. This transition from a high state to a low state at the output 226 of the two-to-one multiplexer 214 may represent a second reset edge 340 of the clock signal. The feedback signal 312 may remain in a high state.

At 342, the first next-clock transition 336 may propagate to the full-delayed signal 307 and the inverted full-delayed signal 308. The full-delayed signal 307 may transition from a low state to a high state. The half-delayed signal 306 may remain in a high state. Because the half-delayed signal 306 remains in a high state, the two-to-one multiplexer 214 may continue to output the full-delayed signal 307, at the first input 220, to the output 226 of the two-to-one multiplexer 214. Thus, the first next-clock transition 336, via the full delay signal, may propagate to the output signal 310 as a transition from a low state to a high state. This transition from a low state to a high state at the output signal 310 may represent a second clock edge 344. The second clock edge 344 may be received by the feedback circuit 102. The feedback circuit 102 may toggle the state of the feedback signal 312. Toggling the state of the feedback signal 312 may generate a second next-clock transition 346. The second next-clock transition 346 may represent a state change from a high state to a low state. The second next-clock transition 346 may propagate to the input signal 304. Thus, the input signal 304 may go from a high state to a low state, at 342.

At 348, the second next-clock transition 346 may propagate to the half-delayed signal 306. The half-delayed signal 306 may transition from a high state to a low state. This transition from a high state to a low state may switch the output 226 of the two-to-one multiplexer 214 from the first input 220 to the second input 222. The full-delayed signal 307, at the first input 220 of the two-to-one multiplexer 214, may remain in a high state. The inverted full-delayed signal 308, at the second input 222 of the two-to-one multiplexer 214, may remain in a low state. Switching from the first input 220 to the second input 222 may generate a transition from a high state to a low state at the output 226 of the two-to-one multiplexer 214. This transition at the output 226 of the two-to-one multiplexer 214 may represent a third reset edge 350 at the output signal 310. The feedback circuit 102 may maintain its state, and the feedback signal 312 may remain in a low state.

At 352, the second next-clock transition 346 at the input signal 304 may have propagated to the full-delayed signal 307 and the inverted full-delayed signal 308. Thus, the inverted full-delayed signal 308, at the second input 222 of the two-to-one multiplexer 214, may transition from a low state to a high state. The half-delayed signal 306 may remain in a low state. Because the half-delayed signal 306, at the select input 224 of the two-to-one multiplexer 214, is in a low state, the two-to-one multiplexer 214 may continue to connect the second input 222 to the output 226, propagating the low-to-high transition of the inverted full-delayed signal 308 to the output signal 310. This transition may represent a third clock edge 354.

The third clock edge 354 may propagate to the feedback circuit 102. The feedback circuit 102 may interact with the controller circuit 110 to determine whether a subsequent clock cycle is required for the receiving circuit 102. In this example, the controller circuit 110 may determine that the receiving circuit 102 has completed its task and that the clock generation circuit 106 may end the generation of subsequent clock signals. The controller circuit 110 may provide an indication to the feedback circuit 102. In response to the indication, the feedback circuit 102 may maintain its state, rather than toggling. The feedback signal 312 may remain in a low state.

Figure 3B:
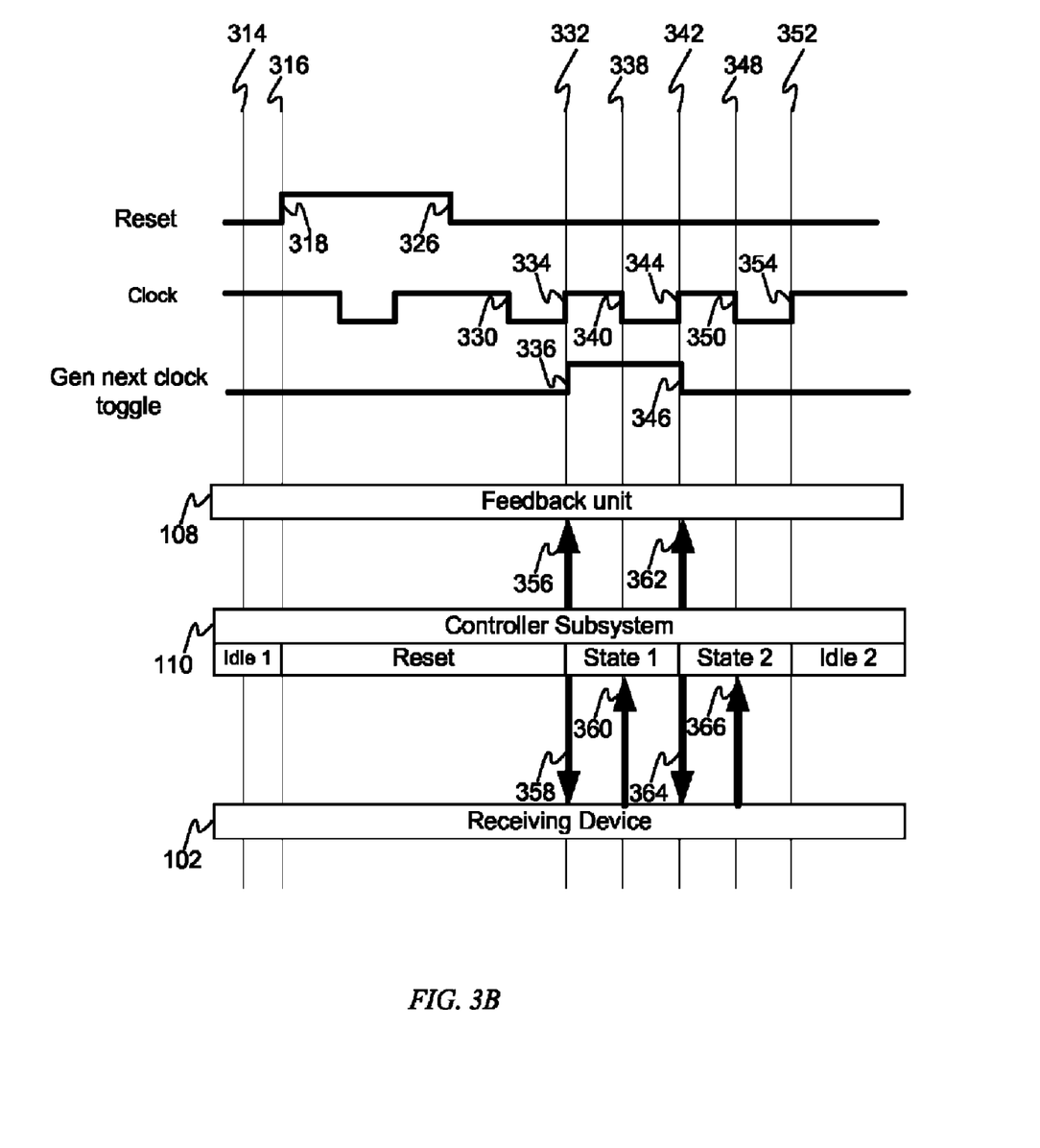

FIG. 3B depicts an example timing diagram of controller activity in response to clock generation. The example timing diagram illustrates an interaction between and/or among the controller circuit 110, the feedback circuit 108, and/or the receiving circuit 102. At 314, the controller circuit 110 is in a first idle state. At 316, the controller circuit 110 may receive the first edge 318 of the reset pulse. The first edge 318 of the reset pulse may indicate to the controller circuit 110 that clock generation is desired. The controller circuit 110 may enter a reset state in response to the first edge 318 of the reset pulse. In the reset state, the controller circuit 110 may monitor the output of the buffer 216 for a first clock signal. In the reset state, the controller circuit 110 may initiate a process of sending commands and receiving status information from and a receiving circuit 102.

At 332, the controller circuit 110 may receive the first clock edge 334. The controller circuit 110 may exit the reset state and enter a first operational state. In the first operational state, the controller circuit 110 may send a first indication 356 to the feedback circuit 108. The first indication 356 may request a subsequent clock edge. In response, the feedback circuit 108 may toggle the feedback signal 312, generating the first next-clock transition 336. In the first operational state, the controller circuit 110 may send a first command 358 to the receiving circuit 102. The receiving circuit 102 may receive the first command 358 and the first clock edge 334 of the output signal 310.

At 338, the receiving circuit 102 may process the first command 358 and may return a first status 360 to the controller circuit 110. The controller circuit 110 may process the first status 360 to determine whether a subsequent clock cycle would enable an operation of the receiving circuit 102.

At 342, the controller circuit 110 may exit the first operational state and enter a second operational state. In the second operational state, the controller circuit 110 may signal a second indication 362 to the feedback circuit 108, requesting a subsequent clock signal. In response to the second indication 362 and/or the second clock edge 344, the feedback circuit 108 may toggle the feedback signal 312. The controller circuit 110 may issue a second command 364 to the receiving circuit 102 in connection with the second clock edge 344. The receiving circuit 102 may process the second command 364.

At 348, the receiving circuit 102 may send a second status 366 indication to the controller circuit 110. In this example, the second status 366 indication may indicate that a task of the receiving circuit 102 is complete. In response to the second status 366 indication, the controller circuit 110 may indicate to the feedback circuit 108 to maintain the present state of the feedback signal 312.

At 352, the receiving circuit 102, controller circuit 110, and/or feedback circuit 108 may receive the third clock edge 354 controller circuit 110 may exit the second operational state and enter a second idle state. The feedback circuit 108 may maintain the state of the feedback signal 312. The receiving circuit 102 may complete its operation and may return to an inactive state.

Figure 4:
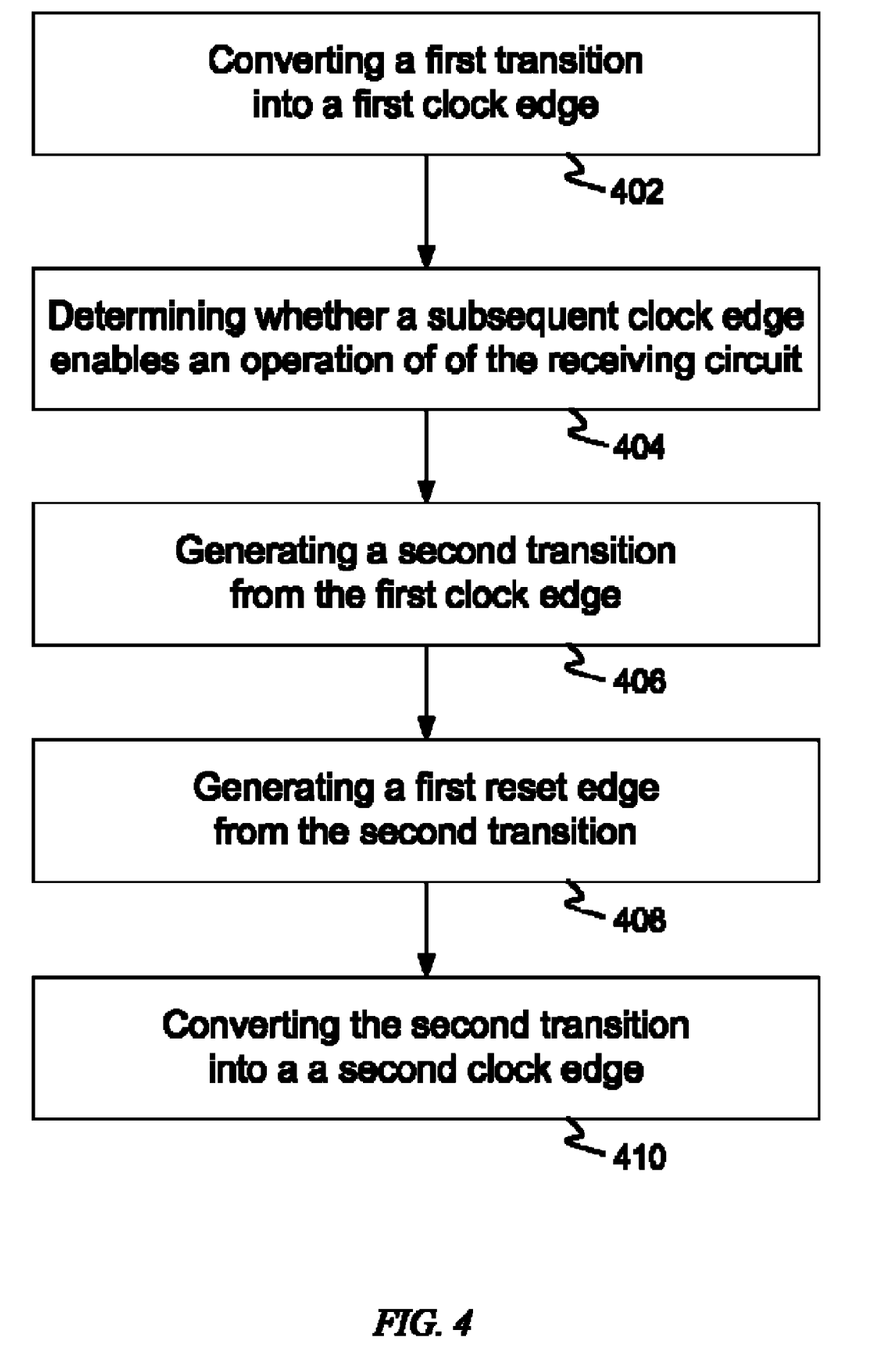
FIG. 4 depicts a flow diagram of an example process for generating a clock signal for a receiving circuit.

FIG. 4 depicts a flow diagram of an example process for generating a clock signal for a receiving circuit 102. For example, a clock signal may comprise a first clock edge 334 followed by a reset edge followed by a second clock edge 344. At 402, a first transition may be converted into a first clock edge 334. For example, a first transition may represent a signal change from a high state to a low state. The first transition may be inverted to represent a transition between a low state and a high state. The first transition may be delayed by a first duration.

At 404, whether a subsequent clock edge enables an operation of the receiving circuit 102 may be determined. For example, the receiving circuit 102 may be queried to determine if a subsequent clock edge would enable an operation of the receiving circuit 102. Also for example, the receiving circuit 102 may provide a status indication that indicates whether a subsequent clock edge enables an operation of the receiving circuit 102. The receiving circuit 102 may indicate that no additional clock edges are required for operation of the receiving circuit 102. For example, the receiving circuit 102 may have completed its operation such that no additional clock edges are necessary.

At 406, a second transition may be generated from the first clock edge 334. For example, the first clock edge 334 may be processed via a feedback loop such that the clock edge generates a second transition. For example, the second transition may be generated by a state toggle in the feedback loop. Also for example, a feedback circuit 108 may receive the first clock edge 334 and may process the clock edge in accordance with the determining whether the subsequent clock edge is required. The feedback circuit 108 may receive an indication that a subsequent clock edge is required, and upon receipt of the first clock edge 334, the feedback circuit 108 may toggle a feedback signal 312 and generate a second transition.

At 408, a first reset edge 330 may be generated from the second transition. A first instance of the second transition may be delayed by a first duration. A second instance of the second transition may be delayed by a second duration that may be less than the first duration. The first duration may correspond to the frequency of the resulting clock signal. The second duration may correspond to the duty cycle of the result in clock signal. The second instance of the second transition may cause a switching from a signal in a high state from a signal in a low state.

At 410, the second transition may be converted into a second clock edge 344. The first instance of the second transition may be inverted. The first instance of the second transition may propagate to the output as the second clock edge 344.

What is claimed:

1. A system for generating a clock signal for a receiving circuit, the system comprising:
    a first delay unit that defines a first duration, wherein the first delay unit receives an input signal and outputs a first delayed signal;
    a second delay unit that defines a second duration, wherein the second duration is less than the first duration and wherein the second delay unit receives the input signal and outputs a second delayed signal;
    a switch to output the clock signal, wherein the switch selects the first delayed signal or an inverted first delayed signal according to the second delayed signal; and
    a feedback unit that generates a first transition of the input signal according to the clock signal.

2. The system of claim 1, wherein the clock signal comprises a first low-to-high transition followed by a first high-to-low transition followed by a second low-to-high transition, wherein the switch outputs the first low-to-high transition by outputting the first delayed signal, wherein the switch outputs the first high-to-low transition by switching from the first delayed signal to the inverted first delayed signal, and wherein the switch outputs the second low-to-high transition by outputting the inverted first delayed signal.

3. The system of claim 1, wherein the second duration is about one-half of the first duration.

4. The system of claim 1, wherein the receiving circuit defines a operating frequency, and the first duration is set relative to an inverse of the operating frequency.

5. The system of claim 1, wherein the feedback unit toggles the state of the input signal according to the clock signal.

6. The system of claim 1, further comprising a pulse generator to generate an initial transition of the input signal, wherein the initial transition of the input signal corresponds to an initial transition of the clock signal.

7. The system of claim 1, wherein the switch comprises a two-to-one multiplexer.

8. The system of claim 1, further comprising a controller circuit connected to the feedback unit, wherein the controller circuit provides to the feedback unit an indication for a subsequent clock signal, and wherein the feedback unit generates the first transition of the input signal according to the clock signal and the indication.

* * * * *